(12) United States Patent
Chen

(10) Patent No.: US 11,094,622 B2
(45) Date of Patent: Aug. 17, 2021

(54) PACKAGED SEMICONDUCTOR DEVICES AND METHODS OF PACKAGING THEREOF

(71) Applicant: Taiwan Semiconductor Manufacturing Company, Ltd., Hsinchu (TW)

(72) Inventor: Hsien-Wei Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 98 days.

(21) Appl. No.: 16/390,701

(22) Filed: Apr. 22, 2019

(65) Prior Publication Data

US 2019/0244887 A1 Aug. 8, 2019

Related U.S. Application Data

(62) Division of application No. 14/471,905, filed on Aug. 28, 2014, now Pat. No. 10,269,693.

(51) Int. Cl.
*H01L 23/498* (2006.01)
*H01L 21/56* (2006.01)
(Continued)

(52) U.S. Cl.
CPC .... *H01L 23/49838* (2013.01); *H01L 21/4853* (2013.01); *H01L 21/52* (2013.01); *H01L 21/563* (2013.01); *H01L 21/565* (2013.01); *H01L 23/3157* (2013.01); *H01L 23/481* (2013.01); *H01L 23/49811* (2013.01); *H01L 23/49816* (2013.01); *H01L 23/5386* (2013.01); *H01L 24/17* (2013.01); *H01L 24/81* (2013.01); *H01L 25/0657* (2013.01); *H01L 25/105* (2013.01); *H01L 25/50* (2013.01); *H05K 1/0284* (2013.01); *H05K 1/0313* (2013.01); *H05K 1/111* (2013.01); *H05K 1/181* (2013.01); *H05K 3/40* (2013.01); *H01L 23/3128* (2013.01); *H01L 24/05* (2013.01); *H01L 24/11* (2013.01); *H01L 24/13* (2013.01); *H01L 24/16* (2013.01); *H01L 24/32* (2013.01); *H01L 24/48* (2013.01); *H01L 24/73* (2013.01); *H01L 2224/02135* (2013.01); *H01L 2224/02145* (2013.01);
(Continued)

(58) Field of Classification Search
None
See application file for complete search history.

(56) References Cited

U.S. PATENT DOCUMENTS 5,969,461 A 10/1999 Anderson et al.
7,880,310 B2 2/2011 Mathew
(Continued)

*Primary Examiner* — Shaun M Campbell
*Assistant Examiner* — Aneta B Cieslewicz
(74) *Attorney, Agent, or Firm* — Slater Matsil, LLP

(57) ABSTRACT

Packaging methods for semiconductor devices and methods of packaging thereof are disclosed. In some embodiments, a device includes a packaging apparatus and contact pads disposed on the packaging apparatus. The contact pads are arranged in an array of rows and columns. The contact pads include first contact pads proximate a perimeter region of the packaging apparatus and second contact pads disposed in an interior region of the packaging apparatus. A dam structure that is continuous is disposed around the second contact pads. The contact pads comprise a mounting region for a semiconductor device.

20 Claims, 5 Drawing Sheets

(51) Int. Cl.
  *H01L 25/10*    (2006.01)
  *H01L 25/065*   (2006.01)
  *H05K 1/02*     (2006.01)
  *H05K 1/11*     (2006.01)
  *H05K 1/18*     (2006.01)
  *H01L 21/48*    (2006.01)
  *H01L 21/52*    (2006.01)
  *H01L 23/31*    (2006.01)
  *H01L 23/48*    (2006.01)
  *H01L 23/538*   (2006.01)
  *H01L 23/00*    (2006.01)
  *H01L 25/00*    (2006.01)
  *H05K 3/40*     (2006.01)
  *H05K 1/03*     (2006.01)

(52) U.S. Cl.
  CPC .......... *H01L 2224/02185* (2013.01); *H01L 2224/02245* (2013.01); *H01L 2224/02255* (2013.01); *H01L 2224/0401* (2013.01); *H01L 2224/04042* (2013.01); *H01L 2224/05572* (2013.01); *H01L 2224/10126* (2013.01); *H01L 2224/10145* (2013.01); *H01L 2224/10156* (2013.01); *H01L 2224/10175* (2013.01); *H01L 2224/11013* (2013.01); *H01L 2224/1132* (2013.01); *H01L 2224/1144* (2013.01); *H01L 2224/1145* (2013.01); *H01L 2224/11334* (2013.01); *H01L 2224/11462* (2013.01); *H01L 2224/11849* (2013.01); *H01L 2224/13111* (2013.01); *H01L 2224/13139* (2013.01); *H01L 2224/13147* (2013.01); *H01L 2224/16145* (2013.01); *H01L 2224/16225* (2013.01); *H01L 2224/16227* (2013.01); *H01L 2224/1712* (2013.01); *H01L 2224/26125* (2013.01); *H01L 2224/26145* (2013.01); *H01L 2224/26155* (2013.01); *H01L 2224/26175* (2013.01); *H01L 2224/27013* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2225/06555* (2013.01); *H01L 2225/06575* (2013.01); *H01L 2225/1023* (2013.01); *H01L 2225/1058* (2013.01); *H01L 2924/00014* (2013.01); *H01L 2924/01322* (2013.01); *H01L 2924/1431* (2013.01); *H01L 2924/1436* (2013.01); *H01L 2924/1437* (2013.01); *H01L 2924/1443* (2013.01); *H01L 2924/157* (2013.01); *H01L 2924/15311* (2013.01); *H01L 2924/15331* (2013.01); *H01L 2924/15787* (2013.01); *H01L 2924/15788* (2013.01); *H01L 2924/181* (2013.01); *H05K 2201/09409* (2013.01)

(56) References Cited

U.S. PATENT DOCUMENTS

| | | |
|---|---|---|
| 8,937,381 B1 | 1/2015 | Dunlap et al. |
| 2003/0193092 A1 | 10/2003 | Tan et al. |
| 2004/0251777 A1 | 12/2004 | Yamamoto |
| 2006/0038280 A1 | 2/2006 | Jang et al. |
| 2006/0038282 A1 | 2/2006 | Lange |
| 2007/0095466 A1 | 5/2007 | Tsuda |
| 2009/0085201 A1 | 4/2009 | Mathew |
| 2009/0294162 A1 | 12/2009 | Jeong et al. |
| 2011/0095418 A1 | 4/2011 | Lim et al. |
| 2011/0183267 A1 | 7/2011 | Tsuda |
| 2011/0210436 A1 | 9/2011 | Chow et al. |
| 2011/0260338 A1 | 10/2011 | Lee et al. |
| 2011/0275177 A1 | 11/2011 | Yim et al. |
| 2012/0068353 A1 | 3/2012 | Huang et al. |
| 2012/0159118 A1 | 6/2012 | Wong et al. |
| 2013/0082383 A1 | 4/2013 | Aoya |
| 2014/0001652 A1 | 1/2014 | Chen et al. |
| 2014/0160688 A1 | 6/2014 | Lu et al. |
| 2014/0167263 A1 | 6/2014 | Wu |
| 2015/0008593 A1* | 1/2015 | Takemoto .......... H01L 24/94 257/777 |

\* cited by examiner

US 11,094,622 B2

PACKAGED SEMICONDUCTOR DEVICES AND METHODS OF PACKAGING THEREOF

PRIORITY CLAIM AND CROSS-REFERENCE

This application is a division of U.S. patent application Ser. No. 14/471,905, filed on Aug. 28, 2014 and entitled "Packaged Semiconductor Devices and Methods of Packaging Thereof". This application is also related to U.S. patent application Ser. No. 13/713,034, filed on Dec. 13, 2012 and entitled "Methods and Apparatus for Package with Interposers," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device.

Package-on-package (PoP) devices are a type of 3DIC wherein dies are partially packaged and are then packaged together with another partially packaged die or dies. Interposers and/or printed circuit boards (PCBs) are often used to facilitate the stacking, bonding, and electrical interconnection of the partially packaged dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
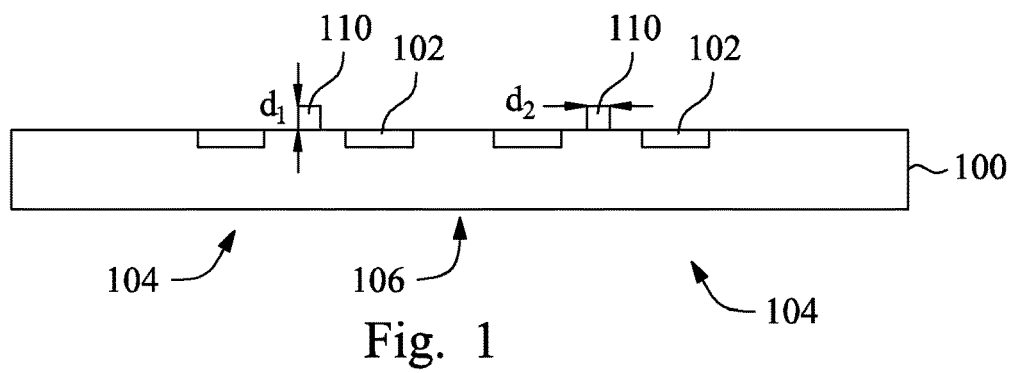
FIG. 1 is a cross-sectional view illustrating a packaging apparatus that includes a dam structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packaged semiconductor devices and methods of packaging thereof are disclosed in the present disclosure. A dam structure comprising a continuous ring is used to control the application of a molding material or underfill material that is disposed around connectors between two devices.

Referring first to FIG. 1, there is shown a cross-sectional view of a packaging apparatus 100 in accordance with some embodiments of the present disclosure. The packaging apparatus 100 includes a plurality of contact pads 102 formed thereon, and a dam structure 110 disposed between contact pads 102 in a perimeter region 104 and contact pads 102 in an interior region 106 of the packaging apparatus 100.

The packaging apparatus 100 comprises a printed circuit board (PCB), an interposer substrate, an integrated circuit die, or a partially packaged semiconductor device in some embodiments, as examples. The packaging apparatus 100 may alternatively comprise other types of devices. In embodiments wherein the packaging apparatus 100 comprises a PCB, the packaging apparatus 100 may comprise a thin board made of fiberglass or another similar material. Electrical wires are "printed" onto the board, connecting various components of devices to be packaged using the packaging apparatus 100. In other embodiments, the packaging apparatus 100 may comprise a substrate such as a high-density interconnect substrate, a silicon substrate, an organic substrate, a ceramic substrate, a dielectric substrate, a laminate substrate, or the like. The packaging apparatus 100 may comprise an interposer substrate that has an interconnect structure disposed proximate contact pads 102 formed on the packaging apparatus 100. The interposer substrate may, or may not, have active or passive components formed thereon.

Figure 2:
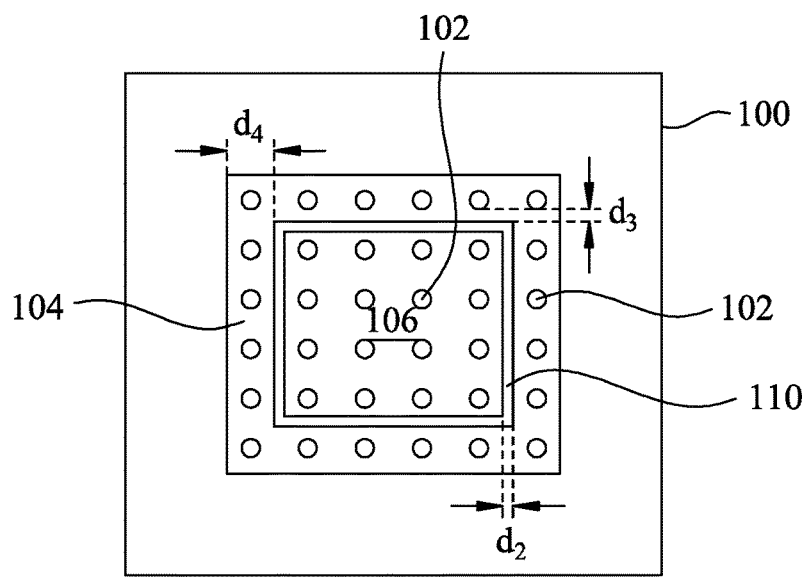
FIGS. 2, 3, and 4 are top views illustrating packaging apparatuses in accordance with some embodiments.

The packaging apparatus 100 includes a plurality of contact pads 102 disposed thereon. The plurality of contact pads 102 is arranged in an array of rows and columns, as shown in FIG. 2. The plurality of contact pads 102 includes a plurality of first contact pads 102 proximate a perimeter region 104 of the packaging apparatus 100 and a plurality of second contact pads 102 disposed in an interior region 106 of the packaging apparatus 100. In embodiments wherein the packaging apparatus 100 does not include contact pads 102 formed thereon as provided, the contact pads 102 are formed on the packaging apparatus 100 in accordance with some embodiments, for example, using subtractive etch processes or damascene processes. The plurality of contact pads 102 make electrical contact with conductive features (not shown) within the packaging apparatus 100, such as conductive lines, vias, and conductive pads, as examples.

A dam structure 110 is formed over the packaging apparatus 100, also shown in FIG. 1. The dam structure 110 is disposed around the plurality of second contact pads 102 in the interior region 106 of the packaging apparatus 100. The dam structure 110 is continuous and comprises a ring-like shape in some embodiments, as illustrated in the top views shown in FIGS. 2, 3, and 4. In some embodiments, the dam structure 110 comprises a conductive material, an insulating material, or a combination or multiple layers thereof, for example. Alternatively, the dam structure 110 may comprise other materials.

In some embodiments, the dam structure 110 comprises a conductive material such as aluminum, copper, titanium, nickel, or other materials. The dam structure 100 may be formed using a deposition process, such as sputtering, to form a layer of material over the packaging apparatus 100, not shown. Portions of the layer of material may then be removed using a suitable process, such as photolithographic masking and etching, to form the dam structures 110. The dam structures 110 may be formed at the same time that the contact pads 102 are formed in some embodiments. In other embodiments, the dam structure 110 may be formed as part of an under-bump-metallurgy (UBM) layer, as another example. In addition, any other suitable process, such as forming an opening, depositing the material for the dam structure 110, and then planarizing the material, may be utilized to form the dam structure 110.

In some embodiments, the dam structure 110 includes an insulating material formed over a conductive material. The insulating material may comprise a dispensed organic isolative material such as an epoxy, a polymer, benzotriazole (BT) or modified silicone, a thermo setting mold compound such as epoxy creasol novolac (ECN) or a modified BT, a thermo plastic compound such as polyethyl sulfone (PES) polycarbonate or polysulfone, or other materials. The insulating material may be deposited above the conductive material of the dam structure 110 and may be formed to a desired shape. The insulating material may be formed using a variety of techniques such as liquid dispense methods, injection transfer molding, thermocompression transfer molding, and other methods. Including an insulating material over the conductive material of the dam structure 110 over the packaging apparatus 100 can make the packaging structure and process more flexible, to adjust to different heights and volumes of molding material or underfill material later used in the packaging process.

In some embodiments, the dam structure 110 comprises only an insulating material, for example. In other embodiments, the dam structure 100 comprises only a conductive material. In other embodiments, the dam structure 100 comprises a first conductive material layer and a second insulating material layer disposed over the first conductive material layer. In yet other embodiments, the dam structure 100 comprises a first insulating material layer and a second conductive material layer disposed over the first insulating material layer. The dam structure 100 may comprise zero, one, or more conductive material layers and zero, one, or more conductive material layers, for example.

Figure 5:
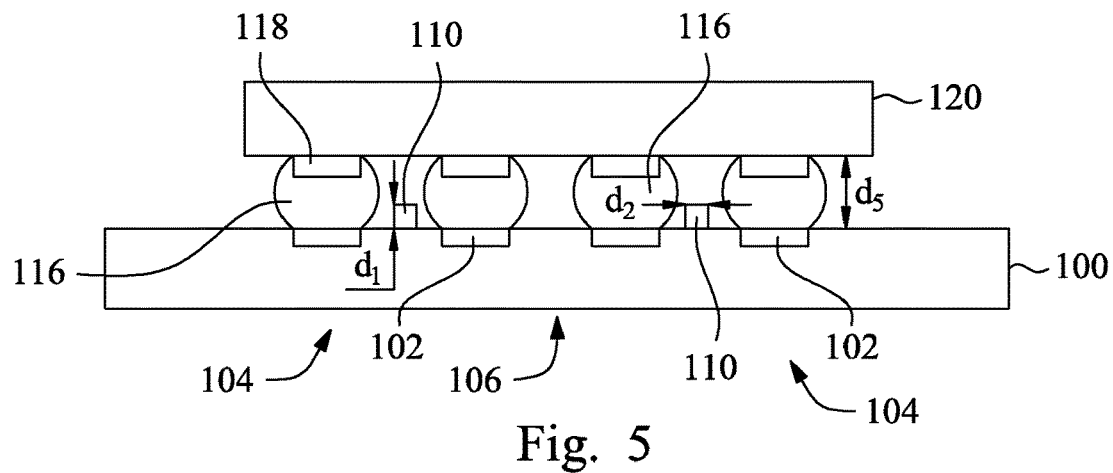
FIGS. 5 and 6 are cross-sectional views illustrating a method of packaging a semiconductor device at various stages in accordance with some embodiments.

The plurality of contact pads 102 of the packaging apparatus 100 comprises a mounting region for a semiconductor device. For example, semiconductor device 120 shown in FIG. 5 is mounted on and coupled to the plurality of contact pads 102 of the packaging apparatus 100 using a plurality of connectors 116.

Figure 3:
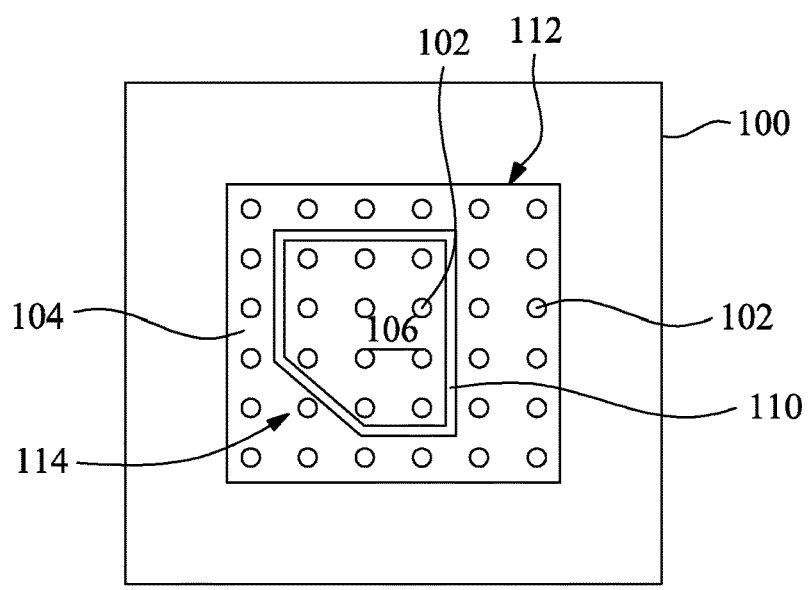
Figure 4:
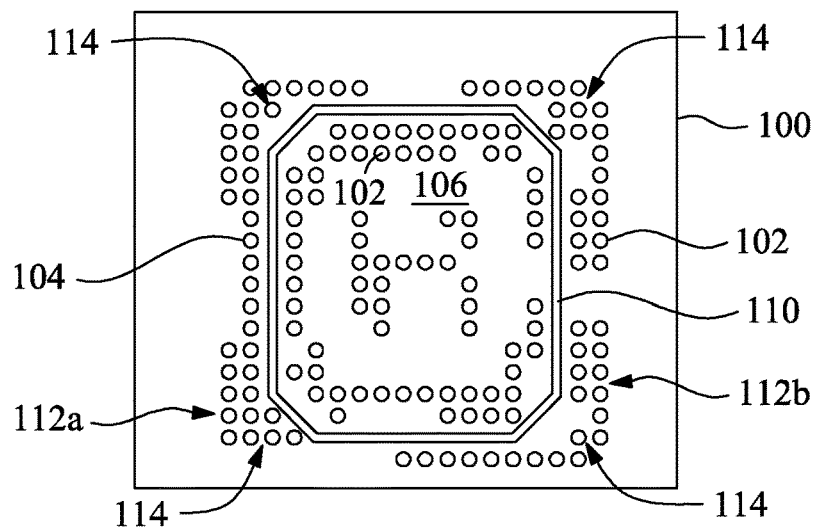

FIGS. 2, 3, and 4 are top views illustrating packaging apparatuses 100 in accordance with some embodiments. The dam structures 110 of the packaging apparatuses 100 may comprise a substantially square, rectangle, polygon, or other shapes in the top view. For example, FIG. 2 illustrates some embodiments wherein the dam structure 110 comprises a substantially square or rectangle shape in the top view. FIGS. 3 and 4 illustrate some embodiments wherein the dam structures 110 comprise the shape of a polygon.

FIG. 2 also illustrates some embodiments wherein the plurality of first contact pads 102 are arranged in a single row and a single column proximate the perimeter region 104 of the packaging apparatus 100. In other embodiments, the plurality of first contact pads 102 is arranged in a plurality of rows or a plurality of columns proximate the perimeter region 104 of the packaging apparatus 100 on at least one side of the packaging apparatus 100, as shown in FIGS. 3 and 4. For example, in FIG. 3, the perimeter region 104 includes two columns of contact pads 102 proximate the right edge 112 of the perimeter region 104 of the packaging apparatus 100. In FIG. 4, the perimeter region 104 of the packaging apparatus 100 also includes two columns of contact pads 102 proximate the left edge 112a and the right edge 112b of the perimeter region 104.

Furthermore, additional contact pads 102 may be included in corner regions 114 of the perimeter region 104 of the packaging apparatus 100, as shown in FIGS. 3 and 4. The corner regions 114 of the perimeter region 104 of the packaging apparatus 100 comprise two or more rows and/or columns in the corner regions 144 in FIG. 4, for example.

The plurality of contact pads 102 on the packaging apparatus 100 is arranged in an array of fully populated contact pads 102 in some embodiments, as shown in FIGS. 2 and 3. In other embodiments, the plurality of contact pads 102 is arranged in an array of partially populated contact pads 102, as shown in FIG. 4. The array arrangements shown in the drawings are merely examples; however, the array of the plurality of contact pads 102 may also be arranged in other arrangements and may comprise other numbers of contact pads 102 than are illustrated.

FIGS. 1 and 2 also illustrate some dimensions of the dam structure 110 and portions of the packaging apparatus 100. The dam structure 110 comprises a height or thickness comprising dimension $d_1$ (see FIG. 1), wherein dimension $d_1$ comprises about 50 µm or greater in some embodiments. In some embodiments, dimension $d_1$ comprises about 10 µm to about 150 µm, for example. The dam structure 110 comprises a width along an edge of the ring-shaped dam structure 110 comprising dimension $d_2$ (see FIGS. 1 and 2), wherein dimension $d_2$ comprises about 50 µm to about 100 µm in some embodiments. A distance or amount of space between the dam structure 110 and an adjacent contact pad 102 comprises dimension $d_3$ (see FIG. 2), wherein dimension $d_3$ comprises about ¼ a width of a contact pad 102 or greater in some embodiments. The perimeter region 104 of the packaging apparatus 100 comprises a width along the edges comprising dimension $d_4$, wherein dimension $d_4$ comprises about a width of a contact pad 102 plus about 200 μm or greater in some embodiments. Alternatively, dimensions $d_1$, $d_2$, $d_3$, and $d_4$ may comprise other values.

Figure 6:
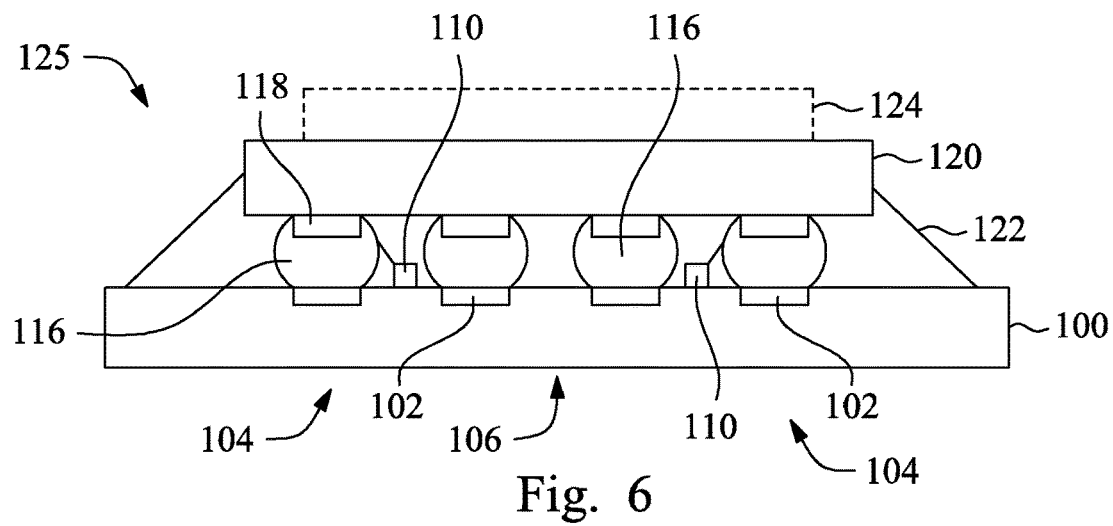

FIGS. 5 and 6 are cross-sectional views illustrating a method of packaging a semiconductor device 120 in accordance with some embodiments. After providing the packaging apparatus 100 that includes contact pads 102 formed thereon (or after forming the contact pads 102 on the packaging apparatus 100) and then forming the dam structure 110 on the packaging apparatus 100 as shown in FIG. 1, a plurality of connectors 116 are coupled to the packaging apparatus 100. A connector 116 is coupled to each of the plurality of contact pads 102. The connectors 116 comprise a eutectic material such as solder, although other materials may also be used.

The connectors 116 may comprise contact bumps such as micro-bumps or controlled collapse chip connection (C4) bumps, and may comprise a material such as tin, or other suitable materials, such as silver or copper. In some embodiments in which the connectors 116 comprise tin solder bumps, the connectors 116 may be formed by initially forming a layer of tin over the contact pads 102 using any suitable method such as evaporation, electroplating, printing, solder transfer, ball placement, etc., to a thickness of about 100 μm, as an example. After the layer of tin has been formed over the contact pads 102, a reflow process may be performed in order to shape the material into the desired connector 116 bump shape.

A semiconductor device 120 is then coupled to the packaging substrate 100, as shown in FIG. 5. The semiconductor device 120 is coupled to the plurality of contact pads 102 of the packaging apparatus 100 using the plurality of connectors 116 coupled to the contact pads 102. The semiconductor device 120 includes a plurality of contact pads 118 formed thereon. The contact pads 118 are arranged in a similar or the same pattern as contact pads 102 on the packaging apparatus 100, for example. The contact pads 118 of the semiconductor device 120 are aligned with and placed adjacent to the connectors 116 on the contact pads 102, and then a eutectic material of the connectors 116 is heated to reflow the eutectic material. The eutectic material is then allowed to cool, leaving the semiconductor device 120 bonded to the packaging apparatus 100 by the connectors 116.

In some embodiments, coupling the semiconductor device 120 to the packaging apparatus 100 comprises coupling an integrated circuit die to the packaging apparatus 100. In other embodiments, coupling the semiconductor device 120 to the packaging apparatus 100 comprises coupling an interposer to the packaging apparatus 100. In yet other embodiments, coupling the semiconductor device 120 to the packaging apparatus 100 comprises coupling a partially packaged semiconductor device 120 to the packaging apparatus 100.

A distance between the packaging apparatus 100 and the semiconductor device 120 comprises a dimension $d_5$, wherein dimension $d_5$ comprises about 60 μm to about 300 μm in some embodiments. Dimension $d_5$ comprises substantially a height of the connectors 116 in some embodiments, for example. The height or thickness of the dam structure 110 comprising dimension $d_1$ comprises about 1/10 or greater than dimension $d_5$ in some embodiments. The connectors 116 may comprise a first height comprising dimension $d_5$, and the dam structure may comprise a second height comprising dimension $d_1$, wherein the second height comprising dimension $d_1$ comprises about 1/10 or greater than the first height comprising dimension $d_5$ in some embodiments, for example. In other embodiments, the second height comprising dimension $d_1$ may comprise about 1/3 or greater than the first height comprising dimension $d_5$, as another example. Alternatively, dimension $d_5$ may comprise other values, and dimensions $d_1$ and $d_5$ may comprise other relative values.

A molding material or underfill material 122 is then disposed around the plurality of first contact pads 102 in the perimeter region 104, the dam structure 110, lower portions of edges of the semiconductor device 120, and connectors 116 of the plurality of connectors 116 that are coupled to the plurality of first contact pads 102 in the perimeter region 104, as shown in FIG. 6. The molding material or underfill material 122 comprises a sidewall molding or underfill material for a packaged semiconductor device 125 in accordance with some embodiments, for example.

Advantageously, the dam structure 110 blocks the flow or formation of the molding material or underfill material 122 past the dam structure 110 into the interior region 106 of the packaging apparatus 100. In some embodiments, substantially no portion of the molding material or underfill material 122 is disposed around the plurality of second contact pads 102 in the interior region 106 of the packaging apparatus 100 within the dam structure 110, as illustrated in FIG. 6. In other embodiments, a small portion of the molding material or underfill material 122 may flow past the dam structure 110 into the interior region 106, not shown. The presence of the dam structure 110 on the packaging apparatus 100 advantageously prevents or reduces the amount of the molding material or underfill material 122 from entering into the interior region 106 of the packaging apparatus 100 around the connectors 116 coupled to the second contact pads 102 in the interior region 106.

The molding material or underfill material 122 may comprise an epoxy, an organic polymer, an organic resin, or a polymer with or without a silica-based or glass filler added, as examples. In some embodiments, the molding material or underfill material 122 comprises a liquid molding compound (LMC) that is a gel type liquid when applied. The molding material or underfill material 122 is then allowed to cure or is cured using heat, ultraviolet (UV) light, or other methods. Alternatively, the molding material or underfill material 122 may comprise other types of insulating and/or encapsulating materials.

FIG. 6 thus illustrates a packaged semiconductor device 125 that includes a semiconductor device 120 coupled to a packaging apparatus 100. The molding material or underfill material 122 is disposed around connectors 116 in the perimeter region 104, and the dam structure 110 prevents the molding material or underfill material 122 from flowing past the dam structure 110 and into the interior region 106 around the connectors 116 and contact pads 102 in the interior region 106.

FIG. 6 also illustrates in phantom (e.g., in dashed lines) an integrated circuit die 124 coupled to the semiconductor device 120, in accordance with some embodiments. The semiconductor device 120 may comprise an interposer in some embodiments, and the integrated circuit die 124 is coupled to the semiconductor device 120 comprising the interposer by a plurality of connectors, not shown.

Figure 7:
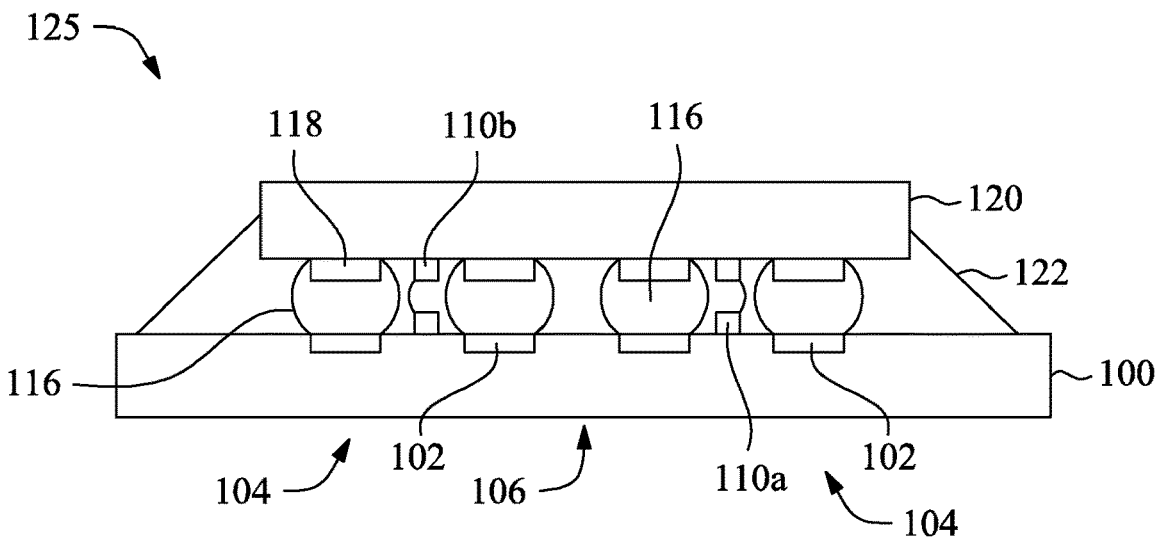
FIG. 7 illustrates a cross-sectional view of a packaged semiconductor device that includes two dam structures in accordance with some embodiments.

FIG. 7 illustrates a cross-sectional view of a packaged semiconductor device 125 that includes two continuous dam structures 110*a* and 110*b* in accordance with some embodiments. The dam structure 110 shown in FIG. 6 comprises a first dam structure 110*a* in FIG. 7. The packaged semiconductor device 125 further comprises a second dam structure 110*b* coupled to the semiconductor device 120 around connectors 116 of the plurality of connectors 116 that are coupled to the plurality of second contact pads 102 in the interior region 106 of the packaging apparatus 100. The second dam structure 110*b* further assists in controlling the application of the molding material or underfill material 122.

Figure 8:
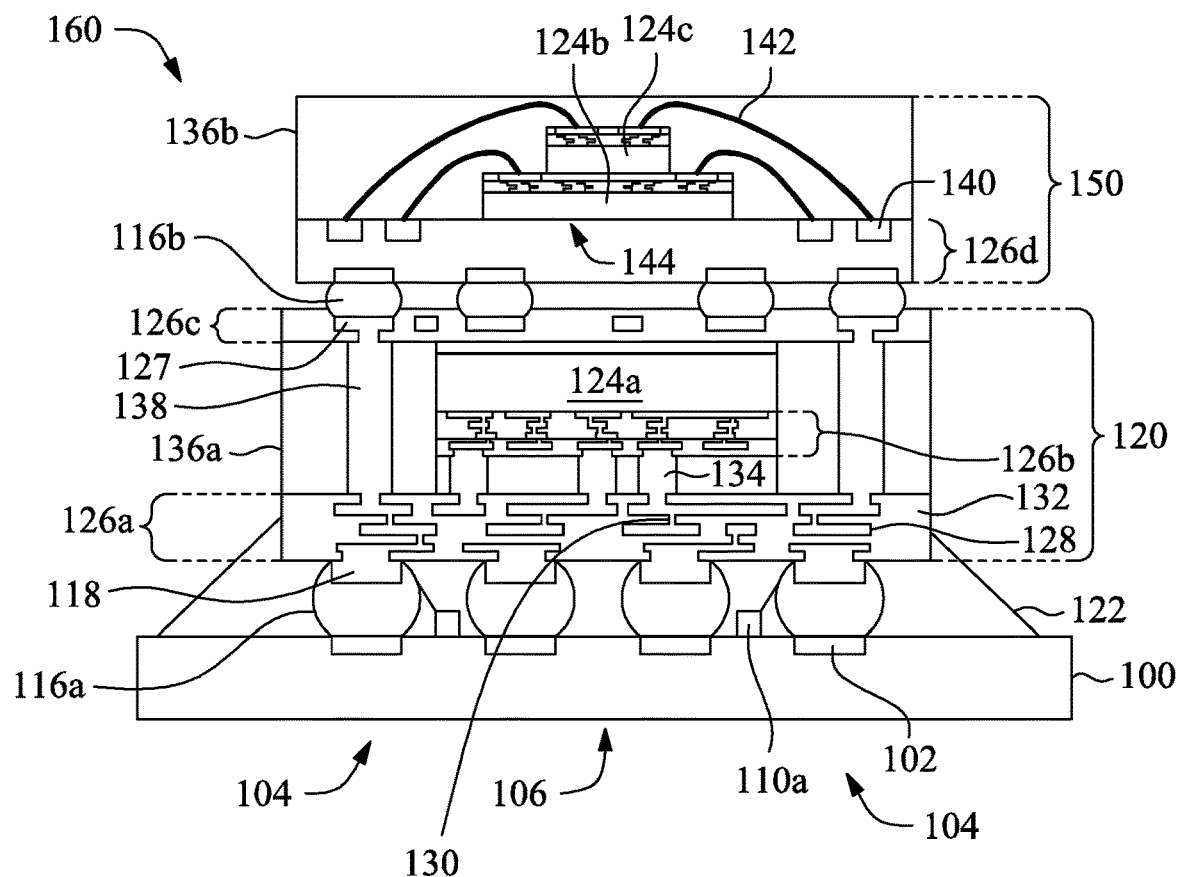
FIGS. 8 through 10 are cross-sectional views of package-on-package (PoP) devices in accordance with some embodiments that include dam structures.
Figure 9:
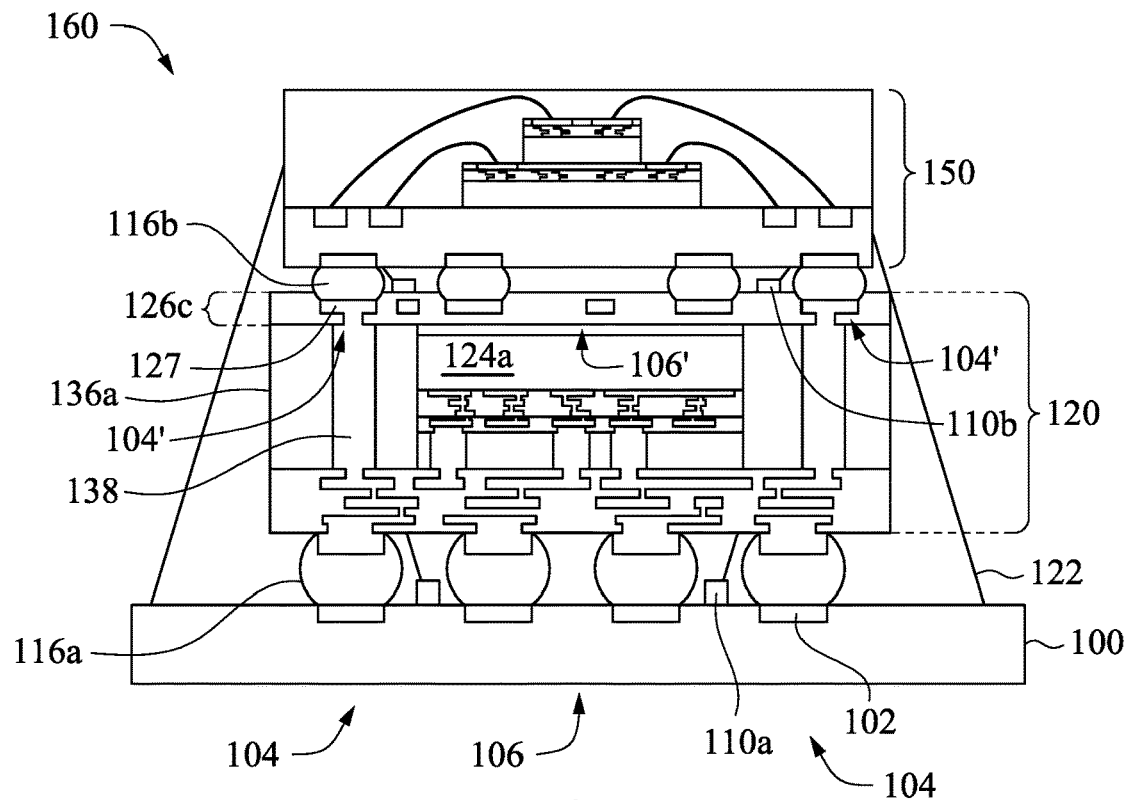
Figure 10:
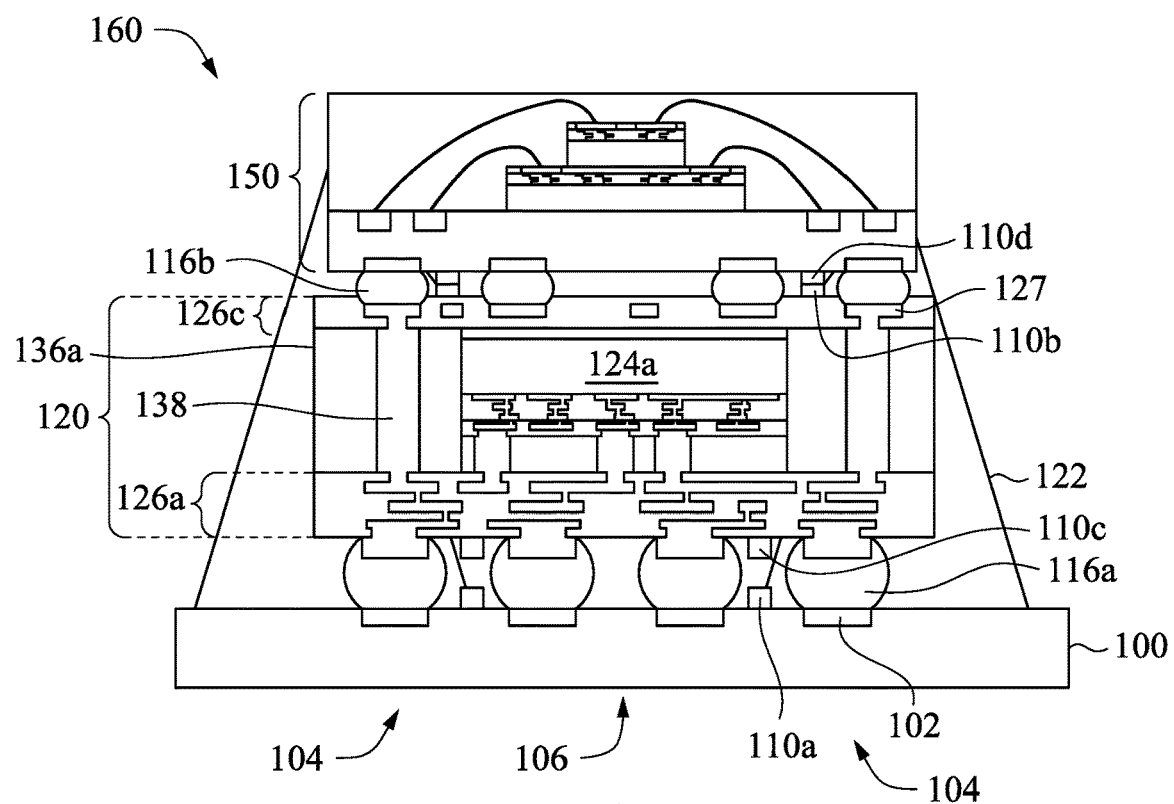

Embodiments of the present disclosure are advantageously implementable in and are particularly beneficial when used in package-on-package (PoP) devices, in some applications. FIGS. 8 through 10 are cross-sectional views of packaged semiconductor devices 160 comprising PoP devices in accordance with some embodiments, that include dam structures 110, 110*a*, 110*b*, 110*c*, and/or 110*d*.

In FIG. 8, a cross-sectional view of a packaged semiconductor device 160 is shown in accordance with some embodiments, wherein a packaging apparatus 100 described herein comprising a PCB is coupled to a semiconductor device 120 comprising a first partially packaged semiconductor device by a plurality of connectors 116*a*. The packaging apparatus 100 includes a dam structure 110 described herein disposed on a surface thereof, between the perimeter region 104 and the interior region 106.

The first partially packaged semiconductor device 120 comprises a first interconnect structure 126*a* coupled to the plurality of connectors 116*a*. The first interconnect structure 126*a* may comprise a redistribution layer (RDL), a post-passivation interconnect (PPI), or other types of interconnections, as examples. The first interconnect structure 126*a* comprises a plurality of conductive lines 128 and vias 130 formed within a plurality of insulating material layers 132. Contact pads 118 are disposed on a surface of the first interconnect structure 126*a*. The contact pads 118 are coupled to the connectors 116*a*.

The first partially packaged semiconductor device 120 further comprises an integrated circuit die 124*a* coupled to the first interconnect structure 126*a*. The integrated circuit die 124*a* includes an interconnect structure 126*b* formed thereon. Portions of the interconnect structure 126*b* of the integrated circuit die 124*a* are coupled to portions of the first interconnect structure 126*a* by conductive plugs 134.

A molding material 136*a* disposed is around the integrated circuit die 124*a*. A plurality of through-vias 138 is disposed in the molding material 136*a*. A second interconnect structure 126*c* is disposed over the integrated circuit die 124*a*, the molding material 136*a*, and the plurality of through-vias 138. The second interconnect structure 126*c* is disposed on an opposite side of the first partially packaged semiconductor device 120 than the first interconnect structure 126*a*.

The first partially packaged semiconductor device 120 is coupled to a second partially packaged semiconductor device 150 by a plurality of connectors 116*b*. The connectors 116*b*, which may comprise solder balls or other materials, are coupled between contact pads of the first partially packaged semiconductor device 120 (e.g., contact pads 127 on the second interconnect structure 126*c*) and contact pads of the second partially packaged semiconductor device 150, for example. Some contact pads 127 of the second interconnect structure 126*c* are coupled to the integrated circuit die 102, and some of the contact pads 127 of the second interconnect structure 126*c* are coupled to the through-vias 138, in some embodiments. In some embodiments, the packaged semiconductor device 160 comprises a package-on-package (PoP) device, for example.

The first partially packaged semiconductor device 120 includes the plurality of through-vias 138 formed within the molding material 136*a*. The through-vias 138 provide vertical connections for the first partially packaged semiconductor device 120. The first and second interconnect structures 126*a* and 126*c* provide horizontal electrical connections for the first partially packaged semiconductor device 120.

The second partially packaged semiconductor device 150 also includes an interconnect structure 126*d* that provides horizontal electrical connections for the second partially packaged semiconductor device 150. The interconnect structure 126*d* of the second partially packaged semiconductor device 150 is coupled to the second interconnect structure 126*c* of the first partially packaged semiconductor device 120 by the plurality of connectors 116*b*.

The second packaged semiconductor device 150 includes one or more integrated circuit dies 124*b* and/or 124*c* coupled to a substrate 144. In some embodiments, the dies 124*b* and 124*c* comprise memory chips. For example, the dies 124*b* and 124*c* may comprise dynamic random access memory (DRAM) devices in some embodiments. Alternatively, the dies 124*b* and 124*c* may comprise other types of chips. Wire bonds 142 may be coupled to contact pads on a top surface of the integrated circuit die or dies 124*b* and 124*c* at one end, and the other end of the wire bonds 142 may be coupled to bond pads 140 on the substrate 144. The wire bonds 142 provide vertical electrical connections for the second partially packaged semiconductor device 150 in some embodiments, for example. A molding material 136*b* may be disposed over the wire bonds 142, the integrated circuit dies 124*b* and/or 124*c*, and the substrate 144.

When the molding material or underfill material 122 is applied to the packaged semiconductor device 160, the dam structure 110 prevents the molding material or underfill material 122 from entering the interior region 106 of the packaging apparatus 100, as previously described herein.

In some embodiments, the packaged semiconductor device 160 may comprise a system-on-a-chip (SOC) device, as another example.

Note that interconnect structures 126*b*, 126*c*, and 126*d* may comprise similar types of interconnect structures, elements, and material layers as described for interconnect structure 126*a*.

In FIG. 9, some embodiments of the present disclosure are illustrated wherein a packaged semiconductor device 160 includes a second partially packaged semiconductor device 150 coupled to a first partially packaged semiconductor device 120. Not all of the elements are labelled in FIGS. 9 and 10 for simplification of the drawings; refer to FIG. 8.

In FIG. 9, the second partially packaged semiconductor device 150 is coupled to the first partially packaged semiconductor device 120 by a plurality of the connectors 116*b* disposed on the plurality of contact pads 127 formed on the second interconnect structure 126*c* of the first partially packaged semiconductor device 120. The plurality of contact pads 127 on the second interconnect structure 126*c* are arranged in an array of rows and columns. The plurality of contact pads 127 on the second interconnect structure 126*c* comprises a plurality of third contact pads 127 proximate a perimeter region 104' of the second interconnect structure 126*c* and a plurality of fourth contact pads 127 disposed in an interior region 106' of the second interconnect structure 126*c*.

In FIG. 9, the dam structure 110*a* on the packaging apparatus 100 comprises a first dam structure 110*a*, and the second interconnect structure 126*c* of the first partially packaged semiconductor device 120 further comprises a second dam structure 110*b* disposed around the plurality of fourth contact pads 127 in the interior region 106' of the second interconnect structure 126c. The second dam structure 110b comprises a continuous ring and is disposed between the plurality of fourth contact pads 127 in the interior region 106' and the plurality of third contact pads 127 in the perimeter region 104' of the second interconnect structure 126c.

A portion of the molding material or underfill material 122 is also disposed around the plurality of third contact pads 127 in the perimeter region 104' of the second interconnect structure 126, the second dam structure 110b, lower portions of edges of the second partially packaged semiconductor device 150, and connectors 116b of the plurality of connectors 116b formed on the second interconnect structure 126c that are coupled to the plurality of third contact pads 127 in the perimeter region 104' of the second interconnect structure 126c.

FIG. 10 is a cross-sectional view of a packaged semiconductor device 160 in accordance with some embodiments that includes the two dam structures 110a and 110b shown in FIG. 9, and also includes a third dam structure 110c and/or a fourth dam structure 110d. For example, a third dam structure 110c is disposed on a bottom surface of the first partially packaged semiconductor device 120. The third dam structure 110c is continuous and is disposed proximate the first dam structure 110a. A fourth dam structure 110d is disposed on a bottom surface of the second partially packaged semiconductor device 150. The fourth dam structure 110d is continuous and is disposed proximate the second dam structure 110b.

Note that in accordance with some embodiments, only one of the first dam structure 110a, the second dam structure 110b, the third dam structure 110c, or the fourth dam structure 110d may be implemented in a packaged semiconductor device 160. Two or more of the first dam structure 110a, the second dam structure 110b, the third dam structure 110c, and/or the fourth dam structure 110d may be implemented in a packaged semiconductor device 160, in other embodiments. As one example, an embodiment similar to FIG. 7 can be implemented with partially packaged devices 120 and 150. Dam structure 110a can be coupled to the packaging apparatus 100, and a dam structure 110c can be coupled to the first interconnect structure 126a of the first partially packaged semiconductor device 120 around connectors 116a that are coupled to the contact pads 102 in the interior region 106 of the packaging apparatus 100.

Figure 11:
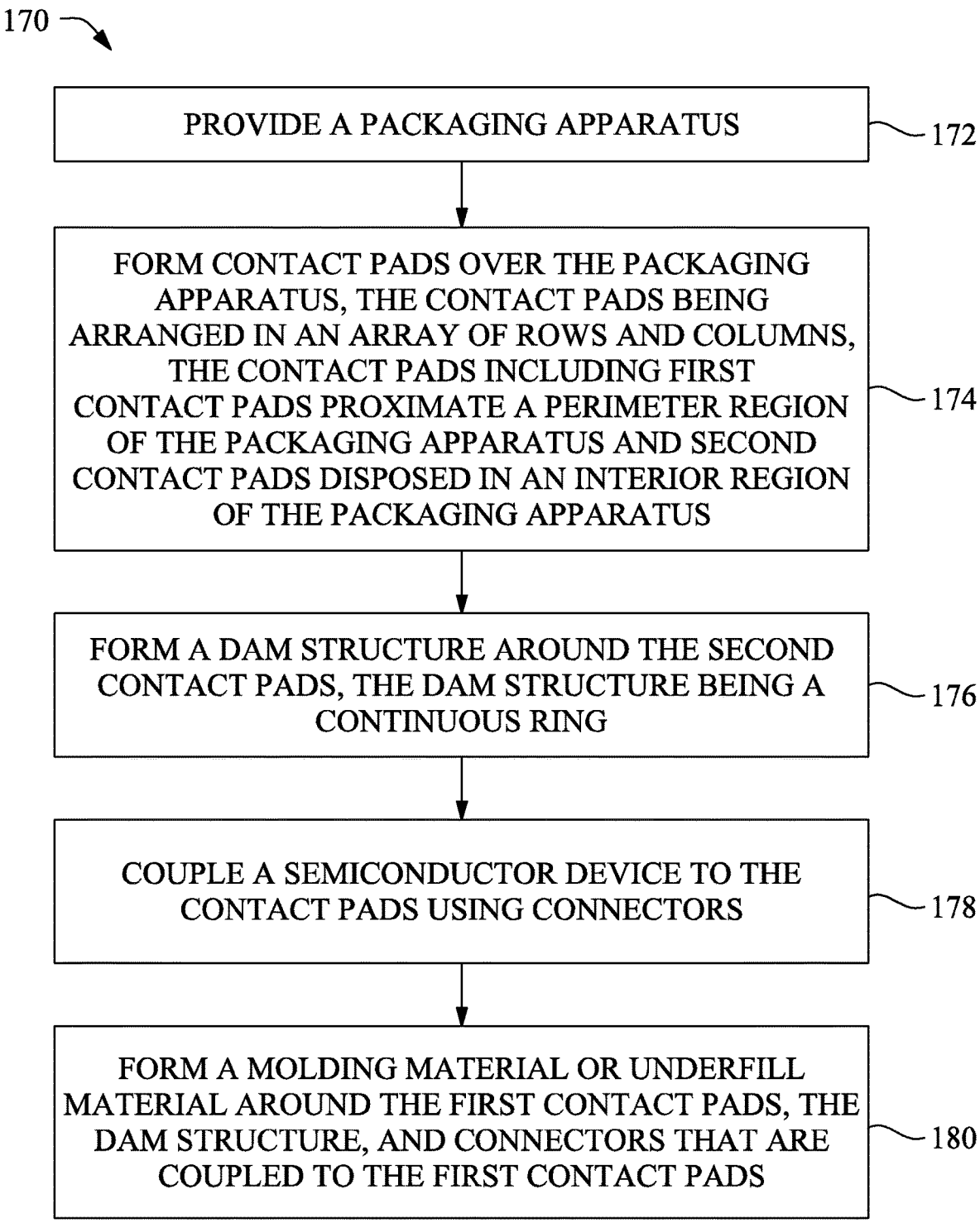
FIG. 11 is a flow chart of a method of packaging a semiconductor device in accordance with some embodiments.

FIG. 11 is a flow chart 170 of a method of packaging a semiconductor device in accordance with some embodiments. In step 172, a packaging apparatus 100 is provided (see also FIG. 1). In step 174, contact pads 102 (FIG. 1) are formed over the packaging apparatus 100, the contact pads 102 including first contact pads proximate a perimeter region 104 of the packaging apparatus 100 and second contact pads disposed in an interior region 106 of the packaging apparatus 100. In step 176, a dam structure 110 is formed around the second contact pads (e.g., in the interior region 106), the dam structure 110 being a continuous ring (FIG. 1). In step 178, a semiconductor device 120 is coupled to the contact pads 102 using connectors 116 (FIG. 5). In step 180, a molding material or underfill material 122 is formed around the first contact pads 102, the dam structure 110, and connectors 116 that are coupled to the first contact pads 102 (e.g., in the perimeter region 104) (FIG. 6).

Advantages of some embodiments of the present disclosure include providing novel continuous, ring-shaped dam structures for improved control of molding material and underfill material application in the packaging of semiconductor devices. By avoiding forming the molding material or underfill material in interior regions of the packaged semiconductor devices, pitting of the molding material or underfill material in the interior regions is avoided, which prevents possible delamination of material layers that the dam structures are formed on, such as the packaging apparatus, the first interconnect structure of the first partially packaged device, the second interconnect structure of the first partially packaged device, and the interconnect structure of the second partially packaged device, as examples.

Fewer defects in the application of the molding material or underfill material are also achieved. Including the dam structures in packaged semiconductor devices results in improved reliability performance. In some embodiments, no additional photo-masks or lithography processes are needed to form the dam structures. The dam structures described herein can be implemented on any surface of a packaged semiconductor device where a molding material or underfill material is planned to be used. Furthermore, the packaging methods and structures described herein that include the novel dam structures are easily implementable in packaging process flows.

In some embodiments, a device includes a packaging apparatus and a plurality of contact pads disposed on the packaging apparatus. The plurality of contact pads is arranged in an array of rows and columns and includes a plurality of first contact pads proximate a perimeter region of the packaging apparatus and a plurality of second contact pads disposed in an interior region of the packaging apparatus. A dam structure is disposed around the plurality of second contact pads. The dam structure is continuous. The plurality of contact pads comprise a mounting region for a semiconductor device.

In other embodiments, a packaged semiconductor device includes a PCB and a plurality of contact pads disposed on the PCB. The plurality of contact pads is arranged in an array of rows and columns and includes a plurality of first contact pads proximate a perimeter region of the PCB and a plurality of second contact pads disposed in an interior region of the PCB. A dam structure is disposed around the plurality of second contact pads. The dam structure comprises a continuous ring and is disposed between the plurality of second contact pads and the plurality of first contact pads. A partially packaged semiconductor device is coupled to the plurality of contact pads by a plurality of connectors. A molding material or underfill material is disposed around the plurality of first contact pads, the dam structure, lower portions of edges of the partially packaged semiconductor device, and connectors of the plurality of connectors that are coupled to the plurality of first contact pads.

In yet other embodiments, a method of packaging a semiconductor device includes providing a packaging apparatus, and forming a plurality of contact pads over the packaging apparatus. The plurality of contact pads is arranged in an array of rows and columns. The plurality of contact pads includes a plurality of first contact pads proximate a perimeter region of the packaging apparatus and a plurality of second contact pads disposed in an interior region of the packaging apparatus. The method includes forming a dam structure around the plurality of second contact pads, the dam structure comprising a continuous ring, and coupling a semiconductor device to the plurality of contact pads using a plurality of connectors. A molding material or underfill material is formed around the plurality of first contact pads, the dam structure, and connectors of the plurality of connectors that are coupled to the plurality of first contact pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
   providing a packaging apparatus;
   forming a first plurality of contact pads over the packaging apparatus, the first plurality of contact pads being arranged in an array of rows and columns, the first plurality of contact pads comprising a plurality of first contact pads proximate a perimeter region of the packaging apparatus and a plurality of second contact pads disposed in an interior region of the packaging apparatus;
   forming a first dam structure around the plurality of second contact pads, the first dam structure comprising a continuous ring;
   coupling a first semiconductor device to the first plurality of contact pads using a plurality of connectors, the first semiconductor device comprising a second dam structure on a first surface and a third dam structure on a second surface opposite the first surface, the second dam structure being spaced apart from the first dam structure;
   coupling a second semiconductor device to the second surface of the first semiconductor device, the second semiconductor device comprising a fourth dam structure, the fourth dam structure contacting the third dam structure; and
   forming a continuous molding material or a continuous underfill material around the plurality of first contact pads, the first dam structure, and the third dam structure.

2. The method according to claim 1, wherein the forming the first dam structure comprises forming multiple conductive layers.

3. The method according to claim 1, wherein the first semiconductor device is a first partially packaged semiconductor device, and wherein the second semiconductor device is a second partially packaged semiconductor device to the first partially packaged semiconductor device.

4. The method according to claim 1, wherein the coupling the first semiconductor device comprises coupling an integrated circuit die.

5. The method according to claim 1, wherein the coupling the first semiconductor device comprises coupling an interposer, and wherein the method further comprises coupling an integrated circuit die to the interposer.

6. The method according to claim 1, wherein the forming the first plurality of contact pads comprises forming an array of partially populated contact pads or an array of fully populated contact pads.

7. The method according to claim 1, further comprising forming a second plurality of contact pads on the first semiconductor device, wherein the second plurality of contact pads comprises a plurality of third contact pads proximate a perimeter region of the first semiconductor device and a plurality of fourth contact pads disposed in an interior region of the first semiconductor device.

8. The method according to claim 7, further comprising forming the third dam structure around the fourth contact pads.

9. A method of packaging a semiconductor device, the method comprising:
   forming a packaging apparatus, the forming the packaging apparatus comprising:
      forming a first plurality of contact pads over a substrate; and
      forming a first dam structure over the substrate;
   forming a first partially packaged semiconductor device comprising a first die interposed between a first interconnect structure and a second interconnect structure, the forming the first partially packaged semiconductor device comprising:
      forming a second dam structure adjacent to and contacting the first interconnect structure; and
      forming a third dam structure adjacent to and contacting the second interconnect structure;
   attaching the first partially packaged semiconductor device to the packaging apparatus, first connectors electrically coupling the first plurality of contact pads to the first interconnect structure, wherein after the attaching the first partially packaged semiconductor device, the first dam structure is spaced apart from the second dam structure;
   attaching a second partially packaged semiconductor device to the first partially packaged semiconductor device, the second partially packaged semiconductor device comprising a third interconnect structure and a fourth dam structure adjacent to and contacting the third interconnect structure, second connectors electrically coupling the second interconnect structure to the third interconnect structure, the third dam structure physically contacting the fourth dam structure; and
   forming a first molding material or underfill around lateral edges of the first dam structure, the second dam structure, the third dam structure, the fourth dam structure, and the first partially packaged semiconductor device.

10. The method according to claim 9, wherein forming the first plurality of contact pads comprises:
    forming a first set of contact pads in an interior region of a surface of the packaging apparatus; and
    forming a second set of contact pads around the first set of contact pads in a perimeter region of the surface of the packaging apparatus.

11. The method according to claim 10, wherein the first dam structure is disposed within the perimeter region of the surface of the packaging apparatus and around the first set of contact pads.

12. The method according to claim 9, wherein the first dam structure contacts the first molding material or underfill, and wherein the second dam structure is free of the first molding material or underfill.

13. The method according to claim 9, wherein the forming the first dam structure comprises forming a conductive material.

14. The method according to claim 9, wherein the forming the first partially packaged semiconductor device further comprises forming a second molding material around the first die.

15. The method according to claim 14, wherein the forming the first partially packaged semiconductor device further comprises forming a through-via electrically coupling the first interconnect structure and the second interconnect structure.

16. A method of packaging a semiconductor device, the method comprising:
   forming a packaging apparatus, the forming the packaging apparatus comprising:
      forming a first plurality of contact pads over a first substrate; and
      forming a first dam structure over the first substrate and interposed between a first set of the first plurality of contact pads and a second set of the first plurality of contact pads;
   forming a first partially packaged semiconductor device, the forming the first partially packaged semiconductor device comprising:
      forming a first interconnect structure adjacent to and contacting an active side of a first die;
      forming a second dam structure adjacent to and contacting the first interconnect structure;
      forming a second interconnect structure adjacent to and contacting a backside of the first die; and
      forming a third dam structure over the second interconnect structure;
   attaching the first partially packaged semiconductor device to the packaging apparatus, wherein after the attaching the first partially packaged semiconductor device, a surface of the first dam structure faces without contacting a surface of the second dam structure;
   attaching a second partially packaged semiconductor device to the first partially packaged semiconductor device; and
   placing a molding material around the first partially packaged semiconductor device, the third dam structure contacting the molding material, the second dam structure being free of the molding material.

17. The method according to claim 16, wherein the second partially packaged semiconductor device comprises:
   a second die to a first side of a second substrate, the second die being wire bonded to the second substrate; and
   a third die to the second die, the third die being wire bonded to the second substrate.

18. The method of claim 17, wherein the second partially packaged semiconductor device comprises a fourth dam structure adjacent to and contacting a second side of the second substrate, the second side being opposite the first side, wherein the second substrate comprises a third interconnect structure.

19. The method according to claim 18, wherein the third dam structure contacts the fourth dam structure, a sidewall of the third dam structure being parallel to and aligned with a sidewall of the fourth dam structure.

20. The method according to claim 16, wherein the first dam structure comprises a continuous ring.

* * * * *